United States Patent
Dakhiya et al.

(10) Patent No.: US 10,340,577 B2
(45) Date of Patent: Jul. 2, 2019

(54) WIDE BAND DIRECTIONAL COUPLER

(71) Applicant: Eagantu Ltd., Ra'anana (IL)

(72) Inventors: Michael Dakhiya, Tel Aviv (IL); Eran Shaked, Ra'anana (IL); Oleg Dounaevsky, Hadera (IL)

(73) Assignee: Eagantu Ltd., Ra'anana (IL)

( * ) Notice: Subject to any disclaimer, the term of this patent is extended or adjusted under 35 U.S.C. 154(b) by 0 days.

(21) Appl. No.: 15/434,800

(22) Filed: Feb. 16, 2017

(65) Prior Publication Data

US 2017/0237140 A1   Aug. 17, 2017

Related U.S. Application Data

(60) Provisional application No. 62/296,091, filed on Feb. 17, 2016.

(51) Int. Cl.
*H01P 5/18* (2006.01)
*H03F 3/19* (2006.01)
(Continued)

(52) U.S. Cl.
CPC ............... *H01P 5/187* (2013.01); *H03F 1/42* (2013.01); *H03F 3/19* (2013.01); *H03F 3/21* (2013.01);
(Continued)

(58) Field of Classification Search
CPC .. H01P 5/18; H01P 5/185; H01P 5/187; H01P 3/08
(Continued)

(56) References Cited

U.S. PATENT DOCUMENTS 3,426,298 A    2/1969  E et al.
3,575,674 A *  4/1971  Howe, Jr. ............... H01P 5/187
                                                     333/116

(Continued)

FOREIGN PATENT DOCUMENTS

RU       96291 U1    7/2010
RU    2447547 C1    4/2012
RU    2571302 C1   12/2015

OTHER PUBLICATIONS

The International Search Report and the Written Opinion for PCT/US2017/018145, ISA/RU, Moscow, Russia, dated Jun. 8, 2017.

*Primary Examiner* — Dean O Takaoka
(74) *Attorney, Agent, or Firm* — M&B IP Analysts, LLC

(57) ABSTRACT

A wide band directional coupler is disclosed. The coupler includes a main transmission line connected between an input port and an output port; and a coupling transmission line having a first length and connected between a coupling port and an isolation port, wherein the coupling transmission line is coupled to the main transmission line through a coupling capacitive connection and a mutual inductive connection, wherein at least a distance between the main transmission line and the coupling transmission line varies along the first length of the coupling transmission line such that any one of a capacitance value of the capacitive connection and an inductance value of the inductive connection is characterized by a relatively low value, wherein a coupling factor of the wide band directional couple remains substantially constant throughout an operating frequency band of the wide band directional coupler.

18 Claims, 7 Drawing Sheets

(51) Int. Cl.
*H03F 3/21* (2006.01)
*H03F 3/45* (2006.01)
*H03F 1/42* (2006.01)
*H03F 3/24* (2006.01)
*H03F 3/60* (2006.01)
*H01P 3/08* (2006.01)

(52) U.S. Cl.
CPC ......... *H03F 3/245* (2013.01); *H03F 3/45076* (2013.01); *H03F 3/45475* (2013.01); *H03F 3/60* (2013.01); *H03F 2200/111* (2013.01); *H03F 2200/129* (2013.01); *H03F 2200/204* (2013.01); *H03F 2200/207* (2013.01); *H03F 2200/451* (2013.01)

(58) Field of Classification Search
USPC .......................................... 333/109–112, 116
See application file for complete search history.

(56) References Cited

U.S. PATENT DOCUMENTS

| | | | | |
|---|---|---|---|---|
| 3,617,952 A * | 11/1971 | Beech | ................... | H01P 5/185 333/116 |
| 4,311,974 A | 1/1982 | Reddy | | |
| 4,677,399 A | 6/1987 | Dain et al. | | |
| 5,159,298 A | 10/1992 | Dydyk | | |
| 5,424,694 A | 6/1995 | Maloratsky et al. | | |
| 5,532,667 A | 7/1996 | Haertling et al. | | |
| 6,066,994 A | 5/2000 | Shepherd et al. | | |
| 6,140,887 A | 10/2000 | Zheng | | |
| 6,208,220 B1 * | 3/2001 | Logothetis | ............... | H01P 5/185 333/116 |
| 6,496,886 B1 * | 12/2002 | Osaka | ..................... | H01P 5/185 333/109 |
| 7,009,467 B2 * | 3/2006 | Sawicki | ................... | H01P 5/185 333/116 |
| 7,084,715 B2 * | 8/2006 | Al-Taei | ................... | H01P 5/185 333/24 R |
| 7,245,192 B2 * | 7/2007 | Podell | ..................... | H01P 5/185 333/112 |
| 7,605,651 B2 * | 10/2009 | Ripley | ..................... | H03F 3/19 330/133 |
| 7,646,261 B2 * | 1/2010 | Kirkeby | ................... | H01P 5/12 333/112 |
| 7,741,929 B2 | 6/2010 | Hash | | |
| 8,044,749 B1 * | 10/2011 | Witas | ..................... | H01P 5/185 333/112 |
| 8,249,544 B2 * | 8/2012 | Okabe | ..................... | H01P 5/184 327/219 |
| 8,289,102 B2 | 10/2012 | Yamamoto et al. | | |
| 8,558,549 B2 * | 10/2013 | Yamamoto | ......... | G01R 31/2822 324/500 |
| 9,203,133 B2 | 12/2015 | Rogers | | |
| 9,214,715 B2 * | 12/2015 | Mei | ........................ | H01P 5/184 |
| 9,356,330 B1 | 5/2016 | Donoghue et al. | | |
| 9,543,631 B1 | 1/2017 | Antkowiak | | |
| 9,543,632 B2 | 1/2017 | Katabuchi et al. | | |
| 9,553,349 B2 | 1/2017 | Mukaiyama | | |
| 2003/0027539 A1 | 2/2003 | Nagamori et al. | | |
| 2007/0279147 A1 | 12/2007 | Dupont et al. | | |
| 2013/0194054 A1 | 8/2013 | Presti | | |
| 2016/0028363 A1 | 1/2016 | Li | | |

* cited by examiner

WIDE BAND DIRECTIONAL COUPLER

CROSS-REFERENCE TO RELATED APPLICATIONS

This application claims the benefit of U.S. Provisional Application No. 62/296,091 filed on Feb. 17, 2016, the contents of which are hereby incorporated by reference.

TECHNICAL FIELD

The present disclosure relates generally to directional couplers and, more particularly, to wide band radio frequency (RF) directional couplers.

BACKGROUND

Directional couplers are radio frequency passive devices designed to couple a defined amount of the electromagnetic power in a transmission line to a port enabling the signal to be used in another circuit. Specifically, a directional coupler is designed to couple power flowing in one direction. Typically, a directional coupler is structured using a pair of coupled transmission lines. The transmission lines can be realized using coaxial and the planar technologies. Directional couplers manufactured using planar technologies include strip-lines or micro-strips as the transmission lines and are known as "miniature directional couplers".

FIG. 1 is a schematic diagram of a conventional directional coupler 100. The coupler 100 includes a pair of transmission lines 110 and 120. The transmission line 110 is the main transmission line, while the second line 120 is the coupling transmission line. A first end and a second end of the main transmission line 110 are an input port 111 and an output port 112, respectively. A first end and a second end of the coupling transmission line 120 are a coupled port 121 and an isolation port 122, respectively.

The transmission lines 110 and 120 are placed (fabricated) in close proximity to each other such that the main transmission line 110 electromagnetically couples with the coupling transmission line 120. Such coupling causes a mutual inductance and a mutual capacitance between the transmission lines 110 and 120.

A radio frequency (RF) signal is provided at the input port 111. Due to the mutual inductance and the mutual capacitance between the main transmission line 110 and the coupling transmission line 120, a portion of the input RF signal is induced in the coupling transmission line 120. The induced RF signal traverses through the coupling transmission line 120 and is output at the coupled port 121. The remaining portion of the input RF signal traverses through the main transmission line 110 and is obtained from the output port 112.

An important property of a directional coupler is a coupling factor (CF), which is the ratio of the power of the induced signal at the coupling port 121 to the power of the input signal at the input port 111. The coupling factor is measured in decibels (dB). The value of the coupling factor depends on the frequency of an input RF signal, the dimensional tolerances of the spacing of the transmission lines 110 and 120 (i.e., the closer the lines are to each other, the higher the CF is), and the length of the transmission lines 110 and 120 (i.e., the longer the lines are, the higher the CF is).

Specifically, the CF value of a directional coupler is not an absolute function of the transmission lines' lengths, but is a function of the ratio of the length to a wave length of the input RF signal. This phenomenon causes a strong dependence of the coupling factor on the frequency of the input (propagating) RF signal. As demonstrated in FIG. 2, the coupling factor value (labeled as 210) changes or increases as a frequency of the input RF signal increases.

However, for proper application of directional couplers, the value of the coupling factor should be substantially constant for an operating frequency band. The strong dependence of the CF on frequency may therefore limit the possible bandwidth of the couple. For example, a substantially constant would be considered typical allowed tolerance for CF variation is about +/−1 dB, which limits the bandwidth of conventional directional couplers to about 300 MHz.

The narrow bandwidth is a limiting factor for some applications (e.g., when directional couplers are integrated in some circuits). For example, the bandwidths of a directional coupler integrated in a power control circuit installed in a cellular telephone would operate in the entire frequency band of RF signals transmitted by the cellular telephone. For example, in modern communication standards, the frequency band of cellular telephones is between 3 GHz and 4 GHz. As demonstrated above, conventional directional couplers cannot meet this demand.

It would therefore be advantageous to provide a solution that would overcome the challenges noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" may be used herein to refer to a single embodiment or multiple embodiments of the disclosure.

Some embodiments disclosed herein include a wide band directional coupler comprising: a main transmission line connected between an input port and an output port; and a coupling transmission line having a first length and connected between a coupling port and an isolation port, wherein the coupling transmission line is coupled to the main transmission line through a coupling capacitive connection and a mutual inductive connection, wherein at least a distance between the main transmission line and the coupling transmission line varies along the first length of the coupling transmission line such that any one of a capacitance value of the capacitive connection and an inductance value of the inductive connection is characterized by a relatively low value, wherein a coupling factor of the wide band directional couple remains substantially constant throughout an operating frequency band of the wide band directional coupler.

Some embodiments disclosed herein also include a wide band directional coupler comprising: a main transmission line connected between an input port and an output port, wherein the main transmission line includes at least one sub main-line placed in at least one layer of a substrate of the wide band directional coupler; and a coupling transmission line connected between a coupling port and an isolation port, wherein the coupling transmission line includes a plurality of sub coupling-lines, wherein each of the sub coupling-lines is placed in a different layer of the substrate; wherein the coupling transmission line is coupled to the main transmission line through a coupling capacitive connection and a mutual inductive connection, wherein any one of a capacitance value of the capacitive connection and an inductance value of the inductive connection is characterized by a relative low value.

Some embodiments disclosed herein also include a power control circuit, comprising a power amplifier for amplifying an input radio frequency (RF) signal; a wide band directional coupler for sensing a power of the input RF signal, wherein the wide band directional coupler is operable in a plurality of different frequency bands, wherein the coupling factor of the wide band directional coupler remains substantially constant throughout the plurality of different frequency bands; and a differential amplifier coupled to the wide band directional coupler, wherein the differential amplifier adjusts the power amplifier based on the sensing signal provided by the coupler.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
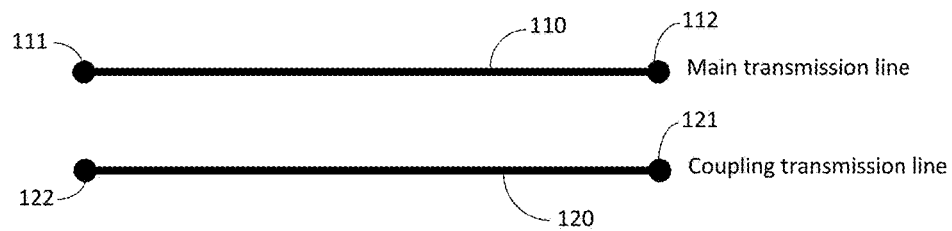
FIG. 1 is schematic diagram of a conventional directional coupler (prior art).
Figure 2:
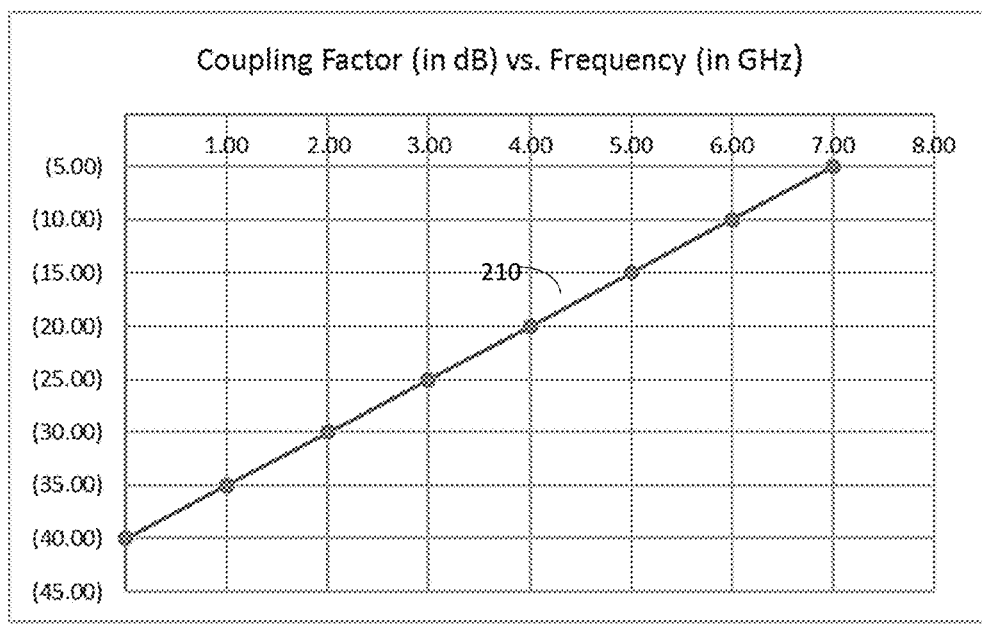
FIG. 2 is a graph showing a coupling factor value as a function of a frequency of the input RF signal in conventional directional coupler.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

By way of example to disclosed embodiments, a wide band directional coupler is provided. In an embodiment, the disclosed coupler is designed to allow weak capacitive and inductive connections between the main and coupling transmission lines. Such a design allows for providing substantially constant coupling factor values for a wide range of operating frequency bands. In an example embodiment, the bandwidth of the disclosed directional coupler is between 3 GHz and 7 GHz. Weak coupling capacitive and mutual inductive connections are realized through relatively low capacitance and inductance values, which are typically between 10% and 50% less than the respective values of some existing designs. Various embodiments for reducing the capacitive and inductive properties of the disclosed coupler are disclosed herein. In another embodiment, a manufacturing process to manufacture the wide band directional coupler is also disclosed.

Figure 3:
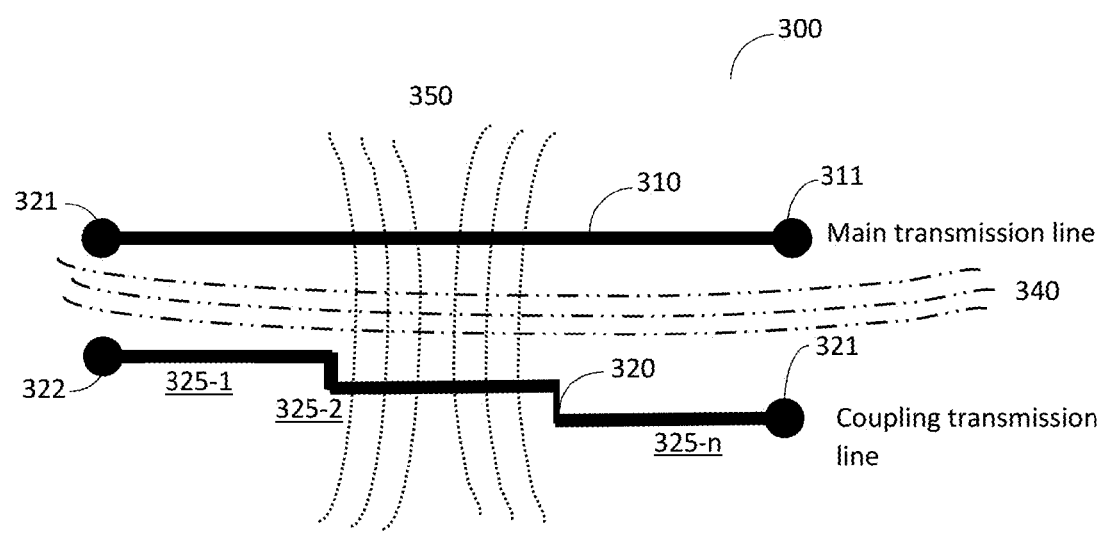
FIG. 3 is a schematic diagram of a wide band directional coupler utilized to described the various disclosed embodiments.

FIG. 3 shows an example diagram of a wide band directional coupler 300 utilized to describe the various disclosed embodiments. The coupler 300 includes a main transmission line 310 and a coupling transmission line 320. In an embodiment, the coupler 300 is a miniature coupler and the transmission lines 310 and 320 are realized as micro-strips, strip-lines, or any other planar technology. The realizing of the transmission lines 310 and 320 may include fabrication of the lines on conductive, resistive, dielectric layers, or a combination thereof, using for example, a low temperature co-fired ceramic (LTCC) process.

The coupler 300 couples radio frequency (RF) signals and can be utilized, for example, for power sensing or probing of an input RF signal. As shown in FIG. 3, a first end and a second end of the main transmission line 310 are an input port 311 and an output port 312, respectively. A first end and a second end of the coupling transmission line 320 are a coupled port 321 and an isolation port 322, respectively. The isolation port 322 may be connected to a common ground (not shown).

A RF signal is provided at the input port 311. Due to the mutual inductance and the mutual capacitance between the main transmission line 310 and the coupling transmission line 320, a portion of the input RF signal is induced in the coupling transmission line 320. The induced RF signal traverses through the coupling transmission line 320 and is output at the coupled port 321. The remaining portion of the input RF signal traverses through the main transmission line 310 and is output at the output port 311.

While the operation of the coupler 300 is similar to that of some existing directional couplers, the coupler 300 operates at a wide frequency band. That is, the coupling factor value of the wide band directional coupler 300 would remain substantially constant for any RF signal having frequency within the operating bandwidth of the coupler 300. In an example embodiment, the operating bandwidth is between 3 GHz and 7 GHz.

The coupling factor value of the coupler is a function of the RF signal's frequency, spacing between transmission the lines, and the length of the transmission lines. The mutual inductance and mutual capacitance existing between the transmission lines 310 and 320 is determined in part based on the spacing between the transmission lines 310 and 320.

According to the disclosed embodiments, the coupling transmission line 320 of the coupler 300 is structured as a combination of quarter wave length (λ/4) coupling lines 325-1 through 325-n. As shown in FIG. 3, the coupling transmission line 320 is formed of 'n' λ/4 lines (where 'n' is an integer greater than 1). The coupling lines 325-1 through 325-n will be referred to hereinafter collectively as "λ/4 coupling lines 325" or individually as a "λ/4 coupling line 325". It should be noted that a λ/4 coupling line 325 can be realized as a micro-strip, a strip-line, or as any other planar technology.

In addition, according to the disclosed embodiments, the wide band directional coupler 300 is structured with a capacitive connection, an inductive connection, or both between the main transmission line 310 and the coupling transmission line 320. The capacitive connection, the inductive connection, or both, are designed to ensure relatively low capacitance and inductance values of the coupler 300. The capacitive connection 340 and the inductive connection 350 are schematically labeled for illustrative purposes only. The various embodiments disclosed herein are directed at weakening the capacitive connections arranged at vertical configuration.

Typically, an inductive connection is defined by the mutual influence of magnetic fields generated around each of the main transmission line 310 and the coupling transmission line 320. Capacitive connection is defined by the mutual influence of electric fields generated between the main transmission line 310 and the coupling transmission line 320.

A miniature directional coupler is arranged in a vertical configuration of the capacitive connection in which the main and coupling transmission lines 310 and 320 are vertically spaced, for example, as illustrated in FIG. 3. The vertical configuration is characterized by a stronger capacitive connection as compared to a horizontal configuration (i.e., where the transmission lines are on the same plane). However, the horizontal configuration of the capacitive connections is not applicable in miniature directional couplers.

It should be noted that the transmission lines 310 and 320 depicted in FIG. 3 are illustrated as straight lines (or combination of straight line), however, the line can be fabricated on a substrate or layer in different shapes. For example, the transmission lines 310 and 320 can be open-circle (open ring-share), half a circle, a triangle, and the like.

Figure 4:
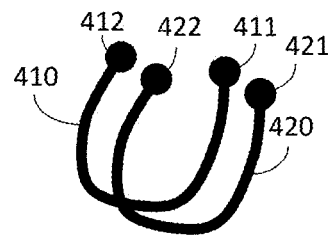
FIG. 4 is a diagram of a wide band directional coupler having ring-shape transmission lines, and utilized to describe the various disclosed embodiments.

FIG. 4 shows an example diagram of a wide band directional coupler 400 having ring-shape transmission lines 410 and 420 utilized to describe the various disclosed embodiments. Specifically, the transmission line 410 is the main line having an input port 411 and an output port 412. The transmission line 420 is the coupling line having an isolated port 421 and a coupling port 422. The ring-shape of the transmission lines allow for reduction of the size of the coupler.

Following is a detailed discussion of the various embodiments for designing capacitive and the inductive connections ensuring relative low capacitance values, inductance values, or both, of the wide band directional coupler. As noted above, the low capacitance values, inductance values, or both, ensure a substantially constant coupling factor value across a wide frequency band or different frequency bands. The disclosed embodiments can lower the capacitance of a capacitive connection and the inductance of an inductive connection by a factor of approximately 10%-50%.

Figure 5A:
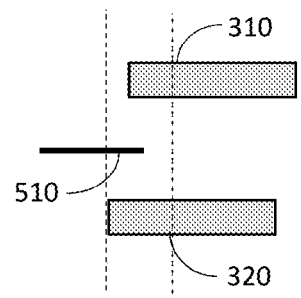
FIGS. 5A and 5B are cross-section diagrams for forming a weak capacitive connection in the wide band directional coupler of FIG. 3 according to an embodiment.

FIG. 5A shows an example cross-section diagram for forming a weak capacitive connection in the wide band directional coupler 300 according to an embodiment. In this embodiment, a single metal plate 510 is placed between the main transmission line 310 and the coupling transmission line 320. The single metal plate 510 can be placed in any vertical location between the lines 310 and 320. The horizontal location, on the other hand, may be from one end of the main line to a third of a length of the main transmission line 310. These locations are schematically marked in FIG. 5A.

The metal plate 510 can be made of any conductive metal material such as, for example, copper, silver, gold, and the like. In example embodiment, the width of the metal plate 510 is between 0.5 μm and 30 μm (microns).

Figure 5B:
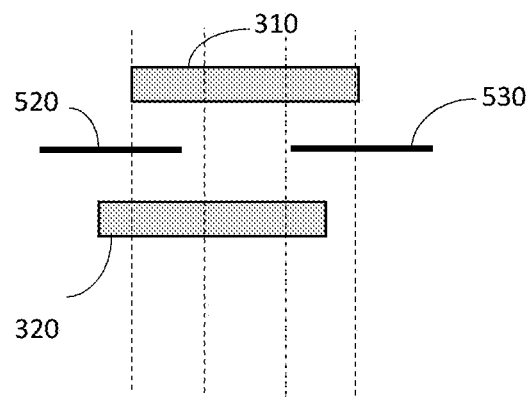

In another embodiment, illustrated in FIG. 5B, two metal plates 520 and 530 are placed between the main transmission line 310 and the coupling transmission line 320. In this embodiment, the plates 520 and 530 can be placed at any vertical location between the lines 310 and 320. The horizontal location of each plate may be from one end of the main transmission line 310 to a third of the length of the main transmission line 310. These locations are scenically marked in FIG. 5B. The metal plates 520 and 530 can be made of any conductive metal material.

It should be appreciated that the metal plate(s) utilized in the disclosed design act as masks to the electric field formed between the main transmission line 310 and the coupling transmission line 320. As a result, the energy of the electric field, and thus, the capacitance between the transmission lines 310 and 320, are reduced. Thus, the designed illustrated in the FIGS. 5A and 5B can be utilized to provide a weak capacitive connection relative to a design without the metal plate(s). The exact placement of the metal plate(s) and their dimensions are determined based on the required coupling factor (CF) to be achieved for the desired frequency band. In another embodiment, the distance between the transmission lines 310 and 320, the length and width each transmission line, or both, may be determined based on the required coupling factor to be achieved for the desired frequency band(s).

Figure 6:
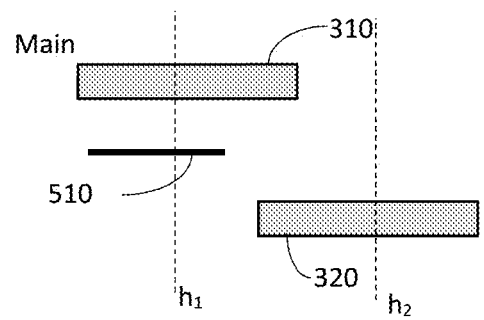
FIG. 6 is a cross-section diagram for forming a weak capacitive connection in the wide band directional coupler of FIG. 3 according to another embodiment.

FIG. 6 shows an example cross-section diagram for forming a weak capacitive connection in the wide band directional coupler 300 according to another embodiment. In this embodiment, the main transmission line 310 and the coupling transmission line 320 are placed in a configuration such that the lines are shifted relative to each, so there is a partial overlap (i.e., at least a portion of each of the lines 310 and 320 covers at least a portion of the other line 310 or 320) between the lines 310 and 320. The shift is only in the horizontal direction. The shift may be up to a half of the length of a transmission line (310 or 320). In an example embodiment, one transmission line is shifted relative to the other transmission line up to half of the length of the transmission line. The exact placement of the shifted transmission lines is determined based on the required coupling factor to be achieved for the desired frequency band. As noted above, in another embodiment, the distance between the transmission lines 310 and 320, the length and width each transmission line, or both, may be determined based on the required coupling factor to be achieved for the desired frequency band(s).

It should be appreciated that the partial overlap between the main transmission line 310 and the coupling transmission line 320 reduces the capacitance between these lines. Thus, the design illustrated in FIG. 6 can be utilized to provide a weak capacitive connection relative to a design where the main transmission line 310 and the coupling transmission line 320 are fully overlapped.

According to some example embodiments, a weak capacitive connection in the wide band directional coupler 300 can be achieved by combining the techniques discussed with reference to FIGS. 5A, 5B, and 6. That is, a weak capacitive connection can be realized using one or two metal plates and a partial overlap of the transmission lines 310 and 320. The exact configuration of the connection is determined based on the required coupling factor to be achieved for the desired frequency band.

Figure 7:
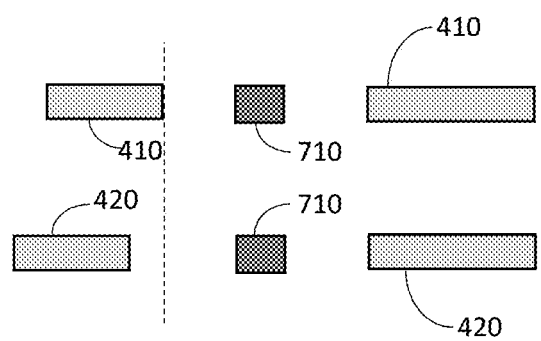
FIG. 7 is a cross-section diagram for forming a weak capacitive connection in the wide band directional coupler of FIG. 4 according to an embodiment.

FIG. 7 shows an example cross-section diagram for forming a weak inductive connection in the wide band directional coupler 400 according to an embodiment. In this embodiment, a metal core 710 is placed inside the ring-shaped main and coupling transmission lines 410 and 420.

The metal core 710 can be made of any conductive metal material such as, for example, copper, silver, gold, and the like. In an example embodiment, the metal core can be shaped as a cylinder having a diameter of the about 30% of the diameter of the ring-shaped transmission line. The metal core 710 can be vertically placed in any location from an edge to the center of the ring-shaped transmission lines. The locations are schematically marked as 701 and 702. The exact placement location and the diameter of the core 710 is determined based on the required coupling factor to be achieved for the desired frequency band. In another embodiment, the distance between the transmission lines 410 and 420, the length and width of each transmission line 410 and 420, or both, may be determined based on the required coupling factor to be achieved for the desired frequency band(s).

It should be appreciated that placing the metal core between the main transmission line 410 and the coupling transmission line 420 reduces the inductance between these lines. Thus, the designed illustrated in FIG. 7 can be utilized to provide a weak inductive connection relative to a design without such a core.

Figure 8:
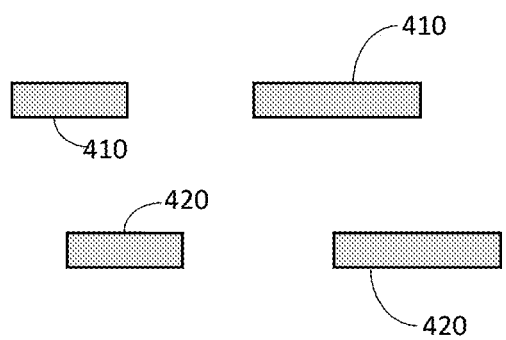
FIG. 8 is a cross-section diagram for forming a weak capacitive connection in the wide band directional coupler of FIG. 4 according to another embodiment.

FIG. 8 shows an example cross-section diagram for forming a weak inductive connection in the wide band directional coupler 400 according to another embodiment. In this embodiment, the ring-shaped main transmission line 410 and the coupling transmission line 420 are shifted relative to each, so there is a partial overlap between the lines 410 and 420. The shift is only in the horizontal direction.

In an example embodiment, the shift may be up to a half of the dimeter of one of the transmission lines 410 or 420, i.e., one line is shifted relative to the other transmission line up to a half of the diameter of the transmission line. The exact placement of the shifted transmission lines is determined based on the required coupling factor to be achieved for the desired frequency band. As noted above, in another embodiment, the distance between the transmission lines 410 and 420, the length and width each transmission line 410 and 420, or both, may be determined based on the required coupling factor to be achieved for the desired frequency band(s).

It should be appreciated that the partial overlap between the main transmission line 410 and the coupling transmission line 420 reduces the inductance between these lines. Thus, the designed illustrated in the FIG. 8 can be utilized to provide a weak capacitive connection relative to a design where the main transmission line 410 and the coupling transmission line 420 are fully overlapped.

According to some example embodiments, a weak inductive connection in the wide band directional coupler 400 can be achieved by combining the techniques discussed with reference to FIGS. 7 and 8. That is, a weak inductive connection can be realized using a metal core and a partial overlap of the transmission lines 410 and 420. The exact configuration of the inductive connection is determined based on the required coupling factor to be achieved for the desired frequency band.

In another embodiment, a wide band directional coupler is designed with asymmetrical geometry to allow for substantially constant coupling factors across different frequency bands. The asymmetrical geometry is realized by changing the distance between the transmission line, the overlapping ratio between the transmission lines, and the width of each transmission line along the length of each transmission line. An example for a wide band directional coupler 900 with an asymmetrical geometry design is provided in FIG. 9.

The coupler 900 also includes a main transmission line 910 and a coupling transmission line 920. The line 910 is ended with an input (911) and output (912) port and the coupling line is ended in with a coupling (921) and isolated port (922). In this embodiment, the main transmission line 910, the coupling transmission line 920, or both can be placed in different layers of the substrate (not shown). This arrangement allows for the combined weakening of capacitive and inductive connections.

Figure 9:
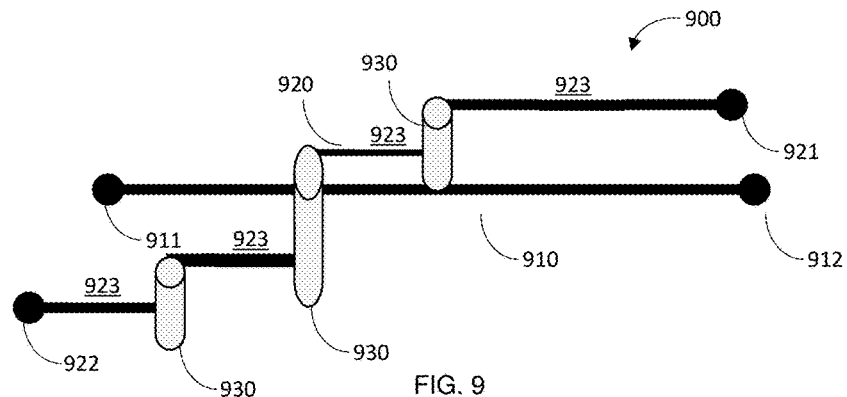
FIG. 9 is a schematic diagram of a wide band directional coupler with an asymmetry geometry design constructed according to an embodiment.

In the example design depicted in FIG. 9, only the coupling transmission line 910 is structured from a plurality of "sub coupling-lines" hereinafter referred collectively as sub-coupling lines 923. Each sub-coupling line 923 residing in different layers (not shown). The connection between two of the sub coupling-lines 923 is through vias 930.

In this embodiment, the distance (Di) of between each sub coupling-line 923 and the main transmission line 910 may be different. Further, the length (Li) and width (Wi) of each sub coupling-line 923 may be different. The exact values Di, Li, and Wi (i=1, . . . , number of sub coupling lines) are determined based on the required coupling factor to be achieved for the desired frequency band(s). In an embodiment, the width of the main transmission line 910 is changed along the length of the transmission line.

Figure 10:
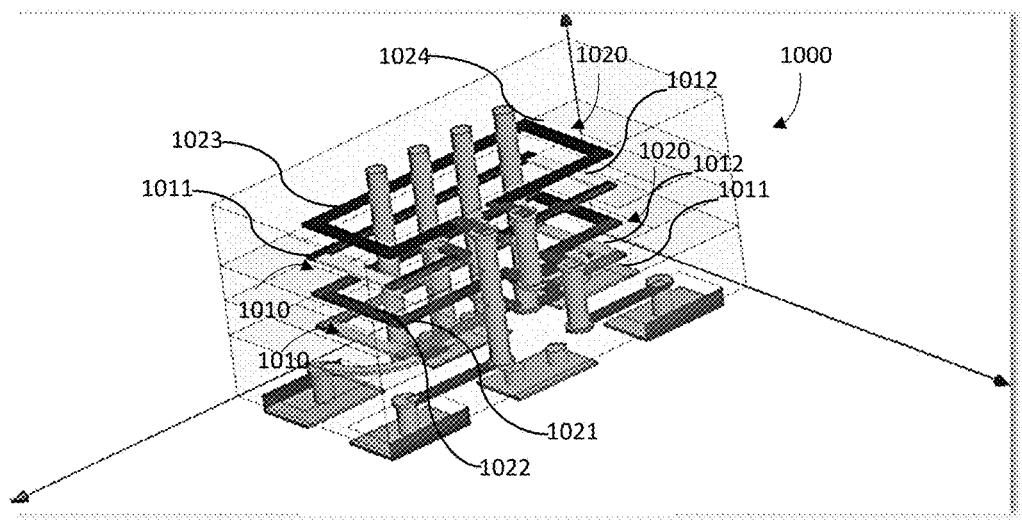
FIG. 10 is an exploded isometric view of a wide band directional coupler with a geometrical design constructed according to an embodiment.

FIG. 10 is an example exploded isometric view of a wide band directional coupler 1000 constructed according to an embodiment. In this embodiment, the coupler 1000 includes main and coupling transmission lines placed in different layers. Specifically, a main transmission line 1010 is placed in two different layers. In a similar fashion, the coupling main transmission line 1020 is placed in two different layers. The overall structure of the coupler 1000 lays on at least different four different layers of the substrate which may include, but is not limited to, conductive layers, resistive layers, dielectric layers, or a combination thereof.

According to this embodiment, each of the main and coupling transmission lines 1010 and 1020 comprises a number of sub lines. As illustrated in the example FIG. 10, the main transmission line 1010 includes two sub-lines 1011 and 1012, while the coupling transmission line 1020 includes four different sub-lines 1021, 1022, 1023, and 1024. Each sub-line has a distinct length, width, or both. Further, the spacing (distance) between the layers is not fixed.

Figure 11:
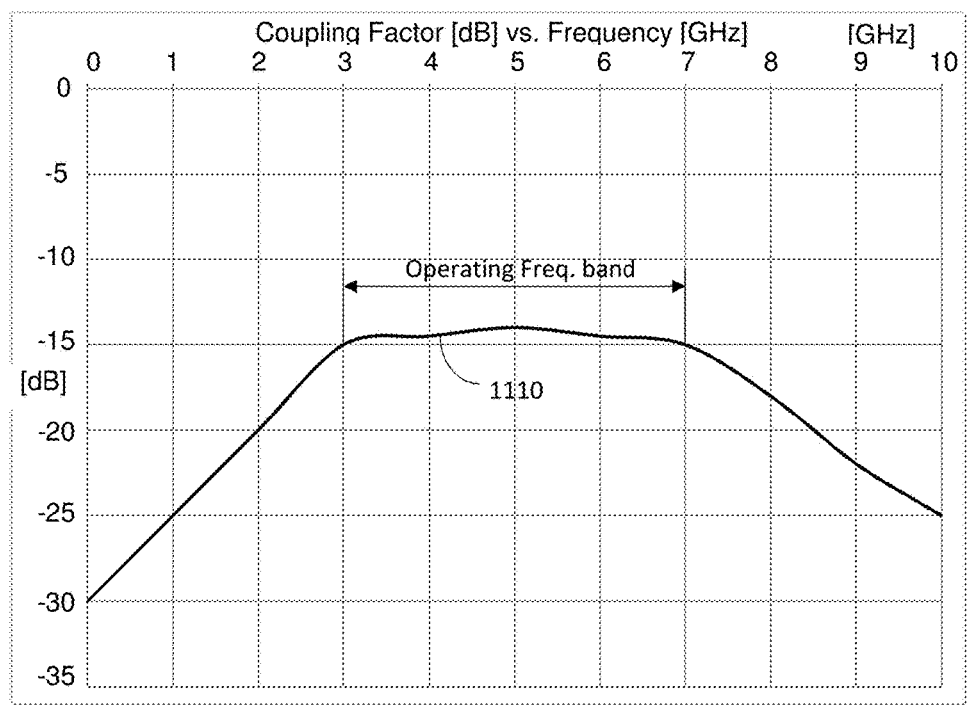
FIG. 11 is a graph showing a coupling factor value as a function of a frequency of the input RF signal in a wide band directional coupler constructed according to an embodiment.

In an example configuration, the wide band directional coupler 1000 can operate in a frequency band between 3.5 GHz and 7 GHz. In this band, the coupling factor value changes approximately 1 dB, which is an acceptable tolerance for many applications, specifically power controllers. A graph 1100 showing the coupling factor value versus the frequency band is illustrated in FIG. 11.

Returning to FIG. 10, in the example configuration shown, the distances between a first layer and a second layer is 120 µm, between the second layer and third layer is 135 µm; and between the third layer to the fourth layer is 144 µm. Further, the main sub-line 1011 is 90 µm and the width of the main sub-line 1012 is 110 µm. The widths of the sub coupling lines 1021, 1022, 1023, and 1024 are 75 µm, 79 µm, 84 µm, and 85 µm, respectively.

The wide band directional coupler 1000 having the example configuration disclosed herein can operate in power controller or detector that requires sensing RF signals having a frequency band between 3.5 GHz and 7 GHz, or RF signals transmitted at discrete frequency bands in the range of 3.5 GHz and 7 GHz.

In an embodiment, the wide band directional couplers disclosed herein can be manufactured using a low temperature co-fired ceramic technology (LTCC) process. The substrate that can be utilized to manufacture the coupler may include between 4 and 26 dielectric layers with permittivity in the range of 4 to 50. The widths of the transmission lines may range from 10 µm to 200 µm. The transmission lines are realized as micro-strips, strip-lines, or as any other planar technology.

Figure 12:
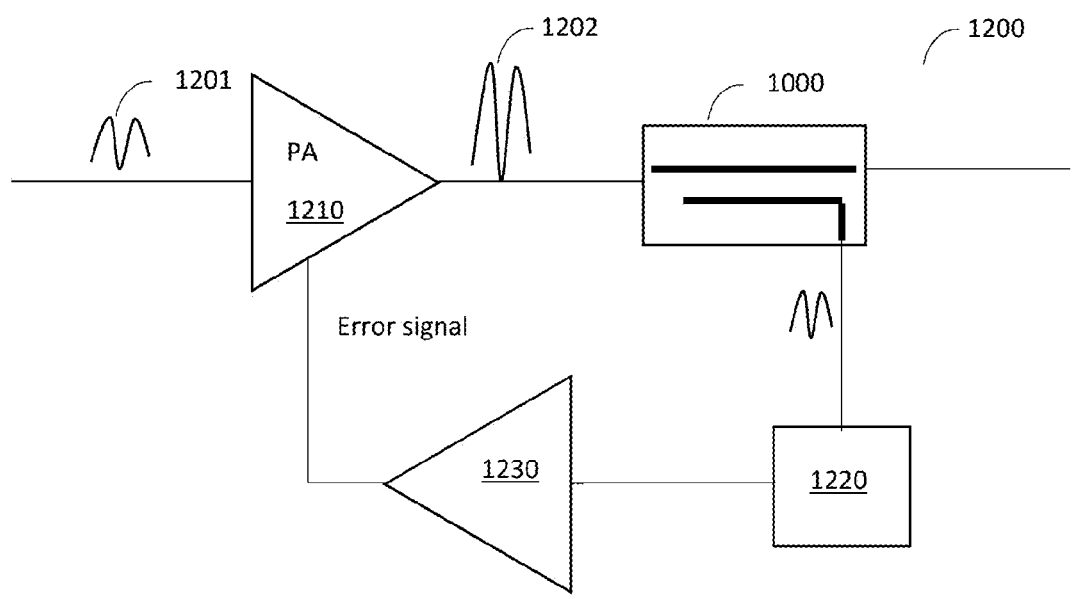
FIG. 12 is a block diagram of a power control circuity including a wide band directional coupler constructed according to an embodiment.

FIG. 12 shows an example block diagram of a power control circuity 1200 including the wide band directional coupler 1000. The circuity 1200 includes a power amplifier (PA) 1210 connected to the coupler 1000, a detector 1220, and a deferential amplifier 1230. An input RF signal 1202 is amplified by the power amplifier 1210 to create an amplified signal 1203. The frequency band of the input RF signal 1202 may be, for example, between 3.5 GHz and 7 GHz.

The amplified signal 1203 is coupled by the directional coupler 1000, and the (coupled) induced signal is input to the detector 1220, which translates the power of the coupled signals into a DC signal.

The DC signal output of the detector 1220 is then compared to a control signal (not shown) using the differential amplifier 1230. Based upon the comparison, the differential amplifier 1230 outputs an error signal that is used to control the power output of the power amplifier 1210. This creates a closed loop system that will set the output power to a level defined by the control signal.

It should be appreciated that the power control circuity 1200 is provided for illustrative purposes only. Other designs of power control circuity can equally operate with the any of the wide band directional couplers disclosed herein without departing from the scope of the disclosure.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A wide band directional coupler, comprising:
   a main transmission line connected between an input port and an output port; and
   a coupling transmission line having a first length and connected between a coupling port and an isolation port, wherein the coupling transmission line is coupled to the main transmission line through a coupling capacitive connection and a mutual inductive connection;
   wherein at least a distance between the main transmission line and the coupling transmission line varies along the first length of the coupling transmission line such that any one of a capacitance value of the capacitive connection and an inductance value of the inductive connection is characterized by a relatively low value;
   wherein a coupling factor of the wide band directional coupler remains substantially constant throughout an operating frequency band of the wide band directional coupler;
   wherein a width of at least the coupling transmission line varies along the first length, and wherein the main transmission line and the coupling transmission line are placed in a configuration such that the lines are shifted relative to each other in a horizontal direction, such that there is a partial overlap between the main transmission line and the coupling transmission line;
   wherein the coupling transmission line includes a plurality of sub coupling-lines, wherein the wide band directional coupler further comprises a substrate, wherein each of the sub coupling-lines is placed in a different layer of the substrate of the wide band directional coupler, wherein the sub coupling-lines are connected through vias; and
   wherein at least one of a width of each of the sub coupling-lines and a length of each of the sub coupling-lines is distinct.

2. The wide band directional coupler of claim 1, wherein the main transmission line partially overlaps the coupling transmission line.

3. The wide band directional coupler of claim 2, wherein a placement of the main transmission line is shifted relative to a placement of the coupling transmission line.

4. The wide band directional coupler of claim 2, wherein the wide band directional coupler further comprises any one of: a single metal plate coupled between the main transmission line and the coupling transmission line, and two metal plates coupled between the main transmission line and the coupling transmission line.

5. The wide band directional coupler of claim 4, wherein the any one of the single metal plate and the two metal plates are coupled to allow partial overlapping between the main transmission line connected to the coupling transmission line.

6. The wide band directional coupler of claim 2, wherein the wide band directional coupler further comprises a metal core inserted between the main transmission line and the coupling transmission line.

7. The wide band directional coupler of claim 1, wherein the main transmission line includes a plurality of sub main-lines, wherein each of the sub mainlines is placed in a different layer of the substrate, wherein the sub main-lines are connected through vias.

8. The wide band directional coupler of claim 1, wherein at least one of a width of each of the sub main-lines and a length of each of the sub main-lines is distinct.

9. The wide band directional coupler of claim 1, wherein a distance between each of the sub main-lines and each of the sub coupling-lines is distinct.

10. The wide band directional coupler of claim 1, wherein the sub mainlines and the sub coupling-lines partially overlap.

11. The wide band directional coupler of claim 1, wherein the wide band directional coupler is a miniature coupler.

12. The wide band directional coupler of claim 11, wherein each of the main transmission line and the coupling transmission line is any one of: a strip-line and micro-strip.

13. The wide band directional coupler of claim 1, wherein the operating frequency band is between 3 Giga Hertz (GHz) and 7 GHz, wherein the operating frequency band includes a plurality of distinct frequency bands.

14. A wide band directional coupler, comprising:
a main transmission line connected between an input port and an output port, wherein the main transmission line includes at least one sub main-line placed in at least one layer of a substrate of the wide band directional coupler; and
a coupling transmission line connected between a coupling port and an isolation port, wherein the coupling transmission line includes a plurality of sub coupling-lines, wherein each of the sub coupling-lines is placed in a different layer of the substrate;
wherein the coupling transmission line is coupled to the main transmission line through a coupling capacitive connection and a mutual inductive connection, wherein any one of a capacitance value of the capacitive connection and an inductance value of the inductive connection is characterized by a relative low value, wherein a width of at least the coupling transmission line varies along the first length, and wherein the main transmission line and the coupling transmission line are placed in a configuration such that the lines are shifted relative to each other in a horizontal direction, such that there is a partial overlap between the main transmission line and the coupling transmission line;
wherein the plurality of sub coupling-lines are connected through vias, wherein at least one of a width of each of the plurality of sub coupling-lines and a length of each of the plurality sub coupling-lines is distinct.

15. The wide directional coupler of claim 14, wherein a coupling factor of the wide band directional coupler remains substantially constant throughout an operating frequency band of the wide directional coupler.

16. The wide band directional coupler of claim 14, wherein each of the at least one sub main-line is placed in a different layer of the substrate and connected through vias, wherein at least one of a width of each of the at least one sub main-lines and a length of each of the least one sub main-lines is distinct.

17. The wide band directional coupler of claim 14, wherein the at least one sub main-line and the sub coupling-lines partially overlap.

18. The wide band directional coupler of claim 14, wherein the operating frequency band is between 3 Giga Hertz (GHz) and 7 GHz, wherein the operating frequency band includes a plurality of distinct frequency bands.

* * * * *